United States Patent
Hsu et al.

(10) Patent No.: US 6,265,257 B1
(45) Date of Patent: Jul. 24, 2001

(54) METHOD OF MAKING A BARRIER LAYER TO PROTECT PROGRAMMABLE ANTIFUSE STRUCTURE FROM DAMAGE DURING FABRICATION SEQUENCE

(75) Inventors: Woan Jen Hsu, Ching-Shue; Chi Kang Liu, Pin-Zei, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/409,877

(22) Filed: Oct. 1, 1999

(51) Int. Cl.[7] .................................................. H01L 21/8238
(52) U.S. Cl. ............................................ 438/215; 438/600
(58) Field of Search ...................................... 438/600, 131, 438/467, 672, 215, 627, 628, 629, 643; 257/50, 530

(56) References Cited

U.S. PATENT DOCUMENTS

| | | | |
|---|---|---|---|
| 5,181,096 | 1/1993 | Forouhi | 257/530 |
| 5,328,865 | 7/1994 | Boardman et al. | 437/60 |
| 5,567,650 | * 10/1996 | Straight et al. | 437/195 |
| 5,656,545 | 8/1997 | Yu | 438/627 |
| 5,677,237 | 10/1997 | Tsai et al. | 437/192 |
| 5,700,726 | 12/1997 | Huang et al. | 437/643 |
| 5,747,379 | * 5/1998 | Huang et al. | 438/586 |
| 5,780,323 | * 7/1998 | Forouhi et al. | 438/131 |
| 5,804,249 | 9/1998 | Sukharev et al. | 427/99 |
| 5,807,786 | * 9/1998 | Chang | 438/600 |
| 5,843,839 | 12/1998 | Ng | 438/637 |
| 5,861,671 | 1/1999 | Tsai et al. | 257/750 |
| 5,977,599 | * 11/1999 | Adrian | 257/382 |
| 6,028,362 | * 2/2000 | Omura | 257/774 |
| 6,087,677 | * 7/2000 | Wu | 257/50 |
| 6,107,165 | * 8/2000 | Jain et al. | 438/467 |

* cited by examiner

*Primary Examiner*—David Nelms
*Assistant Examiner*—David Vu
(74) *Attorney, Agent, or Firm*—George O. Saile; Stephen B. Ackerman; Stephen G. Stanton (57) ABSTRACT

A method for forming an antifuse interconnect structure, for a one-time fusible link, to be used with field-programmable gate arrays, has been developed. The process features the use of an amorphous silicon layer, used as the antifuse layer, with the amorphous silicon layer protected by a thin barrier layer, during the patterning procedure. The protected antifuse layer results in a reproducible thickness, and thus reproducible pulsing voltages, needed for rupturing of the antifuse layer. Planarization of an underlying metal plug, via a conductor layer refill procedure, offers a smooth top surface, flush with the top surface of the adjacent interlevel dielectric layer, for the overlying antifuse layer.

44 Claims, 5 Drawing Sheets

| SiO2 | TiN |
|---|---|
| Insulator | Conductor |
| Peeling on W | No peeling on W |
| After SiO2 CMP, the W plug is higher than IMD because of the good sensitivity for SiO2 CMP on W but bad sensitivity on SiO2. | After TiN CMP (the recipe is as same as W CMP), the surface of W plug and IMD is the same because of the good sensitivity for TiN CMP on IMD. |
|  |  |

METHOD OF MAKING A BARRIER LAYER TO PROTECT PROGRAMMABLE ANTIFUSE STRUCTURE FROM DAMAGE DURING FABRICATION SEQUENCE

FIELD OF THE INVENTION

The present invention relates to methods used to fabricate semiconductor devices, and more specifically to a process for creating improved antifuse-based, programmable interconnect links, for field programmable gate arrays, (FPGA).

BACKGROUND OF THE INVENTION

The problem of having ineffective structures in an integrated circuit design, or the desire to modify a specific design, has been addressed by the use of field-programmable gate arrays, (FPGA). FPGAs been designed to contain the needed row of arrays, as well as additional rows of spare arrays, accessed if needed to replace ineffective counterparts, or to modify a specific design. Recent FPGA designs, feature one-time fusible link structures as possible programmable low resistance interconnect links, if accessed. These additional or spare arrays, or one-time fusible link structures, are sometimes comprised of an antifuse based programmable interconnect structure. The structure consists of an antifuse layer, usually a thin dielectric layer, placed between electrodes or conductive materials. When needed this antifuse material can be ruptured, or converted to a lower resistance layer, via a high voltage electrical pulse, resulting in creation of the replacement array structure.

A thin dielectric layer, comprised of silicon oxide or silicon nitride for example, may be used as the antifuse layer used with the one-time fusible link structure. The dielectric layer has to be thin to allow reasonable programmable voltages to be successfully used. Thus small increases in the thickness of the thin antifuse dielectric layer, due to uniformities in the dielectric layer deposition procedure, may result in inadequate programmed links.

U.S. Pat. No. 5,181,096 to Forouhi describes the use of an amorphous silicon layer, as a part of a composite antifuse layer, sandwiching the amorphous silicon layer with dielectric layers.

U.S. Pat. No. 5,807,786 to Chang (assigned to Taiwan Semiconductor Manufacturing Company, Ltd. as is the present invention) describes a method of using only an amorphous silicon layer as the antifuse layer versus the sandwich structure suggested in Forouhi. To avoid contamination, and additional oxide growth, on the amorphous silicon layer, during patterning procedures, Chang further describes a thin conductive barrier layer is used to overlie, and protect, the amorphous silicon antifuse layer, during specific fabrication sequences. A insulator layer is used to fill in the recesses in the metal (tungsten) plug formed during the metal etch back procedure and is then chemically mechanically polished (CMP) to remove the insulator layer from the top surface of the interlevel dielectric layer (silicon oxide) and from the top surface of the metal plug.

U.S. Pat. No. 5,677,237 to Tsai et al. describes a method of fabricating seamless, tungsten filled, small diameter contact holes. The Tsai et al. process features initially creating a tungsten plug in the small diameter hole and filling or repairing seams or voids in the tungsten plug with an additional layer of selectively deposited tungsten.

U.S. Pat. No. 5,328,865 to Boardman et al. describes a method for making a cusp-free anti-fuse structures.

U.S. Pat. No. 5,804,249 to Sukharev et al. describes a process of forming a tungsten plug by blanket depositing a first bulk layer of tungsten partially filling a via in a dielectric layer. An amorphous or microcrystalline layer of tungsten is then blanket deposited over the first bulk tungsten layer to inhibit the growth of tungsten grains inside the via. A second bulk layer of tungsten is then deposited over the amorphous or microcrystalline layer of tungsten.

U.S. Pat. No. 5,700,726 to Huang et al. describes a process for filling small diameter contact holes with tungsten using two consecutive tungsten depositions. A first tungsten layer is used to coat the sidewalls of the contact hole. A second tungsten layer that will exhibit a significantly slower removal rate than the first layer is then used to completely fill the contact hole.

U.S. Pat. No. 5,656,545 to Yu describes a method of forming planarized tungsten plugs for small diameter contact holes using an RIE (reactive ion etch) etchback process that reduces the seam inherent when filling holes with chemically vapor deposited materials.

U.S. Pat. No. 5,861,671 to Tsai et al. describes a method for fabricating seamless tungsten filled small diameter contact holes. A tungsten plug having a seam or void in deposited in the contact hole then an additional layer of selectively deposited tungsten fills or repairs the seam or void.

U.S. Pat. No. 5,843,839 to Ng describes a method of allowing contact between levels of interconnect metallization structures through the use of a raised tungsten plug structure that permits contact between an underlying active device region and an overlying interconnect metallization structure. The tungsten plug is formed by photolithographic masking and dry etching procedures thus avoiding increasing the size of a tungsten seam in the center of the tungsten plug structure.

U.S. Pat. No. 5,747,379 to Huang et al. describes a process to form seamless tungsten plugs in deep, narrow contact holes. A tungsten plug is formed in a contact hole via tungsten LPCVD processing followed by an RIE etchback and recessing process. A second tungsten LPCVD procedure is then used to fill seams or defects in the first formed tungsten plug followed by another RIE etchback procedure.

SUMMARY OF THE INVENTION

It is an object of this invention to use an antifuse based interconnect, featuring an amorphous silicon, antifuse layer, for the one-time fusible link structure while avoiding current leakage at the interface of the top surfaces of the metal plug and ILD.

Another object of this invention to use an antifuse based interconnect, featuring an amorphous silicon, antifuse layer, for the one-time fusible link structure where the metal plug is flush with the interlevel dielectric layer (ILD).

It is a further object of this invention to provide a structure offering a one-time fusible link, for field programmable gate array designs.

It is another object of this invention to use an antifuse based interconnect, featuring an amorphous silicon, antifuse layer, for the one-time fusible link structure.

In accordance with the present invention a process for forming an antifuse based interconnect structure having minimal current leakage, to be used for a one-time fusible link, is described. A semiconductor substrate, comprised of overlying metal interconnect patterns, contacting conductive regions in the semiconductor substrate, is provided. A first metal interconnect structure, to be used as the lower electrode of the antifuse based interconnect structure, is formed, contacting conductive regions in the semiconductor substrate. An interlevel dielectric layer (ILD) is deposited, followed by a chemical mechanical polishing procedure, used for planarization purposes. A via hole opening is creating in the interlevel dielectric layer, exposing the top surface of the first metal interconnect structure. A thin barrier layer is next deposited, coating the exposed surfaces of the via hole opening, followed by the deposition of a metal layer, completely filling the via hole opening. Chemical-mechanical polishing (CMP) is next used to remove unwanted metal from the top surface of the interlevel dielectric layer, forming a metal plug in the via hole opening. A deposition of a conductor layer, followed by another chemical-mechanical polishing (CMP) procedure, removes the conductor layer from the top surface of the interlevel dielectric layer, and from the top surface of the metal plug, filling any seams in the metal plug, seams that were created because of the tungsten (W) grain. The CMP of the conductor layer leaves the top surface of the metal plug flush with the ILD. An amorphous silicon, antifuse layer, is next deposited, followed by the deposition of a thin titanium nitride layer. Patterning, using photolithographic and dry etching procedures, is used to form the composite antifuse layer, overlying the metal plug. A second metal interconnect structure, to be used as the upper electrode of the antifuse based interconnect structure, is formed overlying the composite antifuse layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The antifuse based interconnect structure to be used for a one-time fusible link of the present invention is formed on a semiconductor substrate, comprised of N type and P type conductive regions, in the semiconductor substrate, with overlying metal and insulator patterns, used for wiring purposes. The antifuse based interconnect structure will be fabricated on the integrated wiring patterns present on the semiconductor substrate. The specific conductive regions in the semiconductor substrate, and the overlying wiring patterns, can be formed to achieve complimentary metal oxide semiconductor field effect transistor, (CMOS), designs, or BiCMOS designs, used for desired memory applications.

Figure 1:
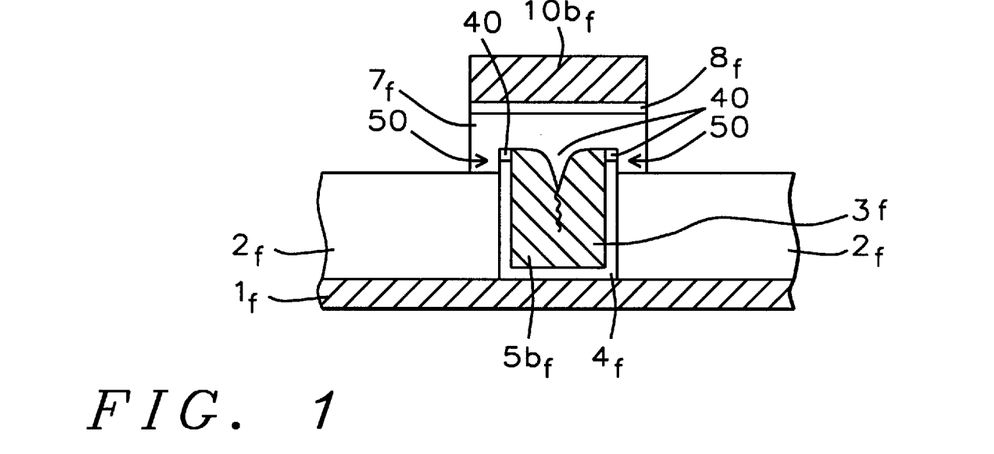
FIG. 1 is a cross-sectional schematic view of a one-time fusible link using an silicon oxide insulator to fill the seam and recesses in the metal plug.

FIG. 1 (with analogous numbering to the figures of the present invention with a suffix "f", that is, the structure includes via hole 3f, second interconnect structure 10bf, titanium nitride layer 4f, layer 7f of amorphous silicon, and layer 8f of titanium nitride.) schematically shows a one-time fusible link that uses an insulator layer 40, usually comprised of $SiO_2$, to fill the seam and recess in metal plug 5bf, usually comprised of tungsten (W), created during the chemical-mechanical polishing of W plug 5bf. While the one-time fusible link that uses an insulator layer to fill in the recesses of the metal plug, such as that described in the U.S. Pat. No. 5,807,786 Chang patent, is very beneficial, the inventors have discovered that tungsten plug 5bf is higher than $SiO_2$ intermetal dielectric layer (IMD) 2f as shown at 50 because of the good sensitivity for TiN (metal) CMP on oxide (IMD) but bad sensitivity for $SiO_2$ CMP on oxide (IMD). Use of $SiO_2$ also causes peeling on W, i.e., the adhesion between $SiO_2$ and W is very bad causing the $SiO_2$ to peel from the W plug after the oxide CMP. Further, a weak point exists at 50 for the anti-fuse and is the point where there is leakage current in the $SiO_2$ insulator layer filled recess W metal plug one-time fusible link and leads to inadequate programmed links.

Figure 9:
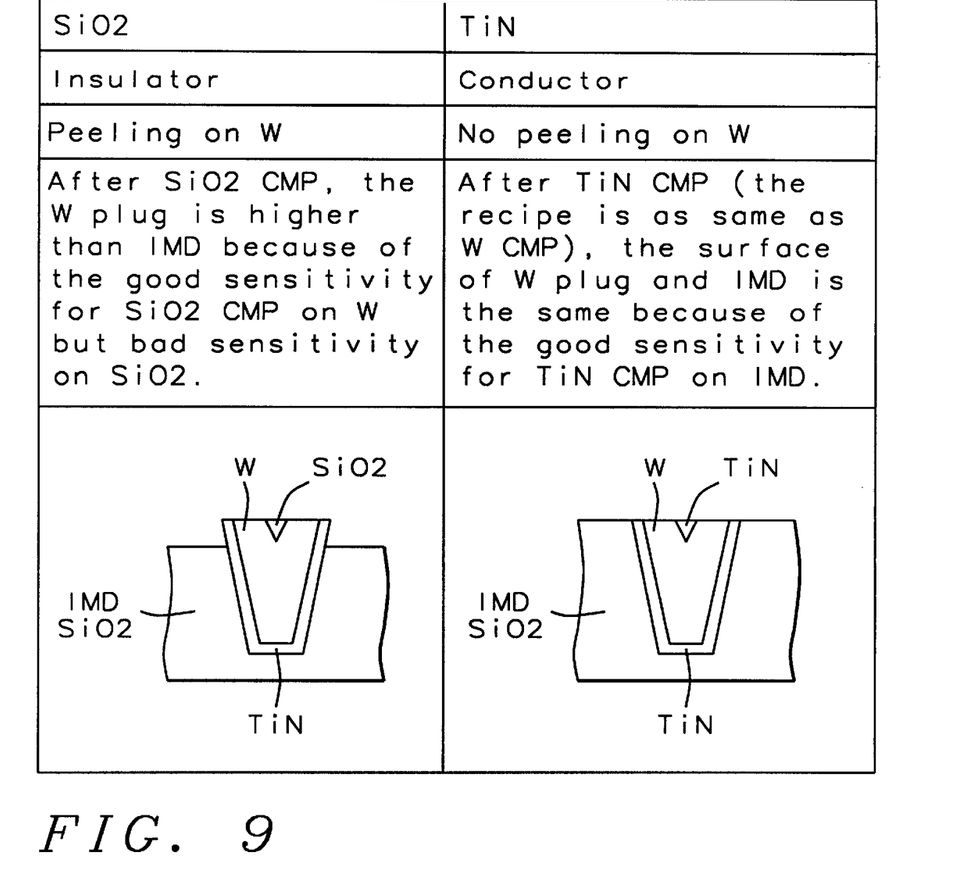
FIG. 9 is a table summarizing the major differences between the one-time fusible link of the present invention and another one-time fusible link that uses an insulator layer to fill in the seams of the metal plug.
Figure 10A:
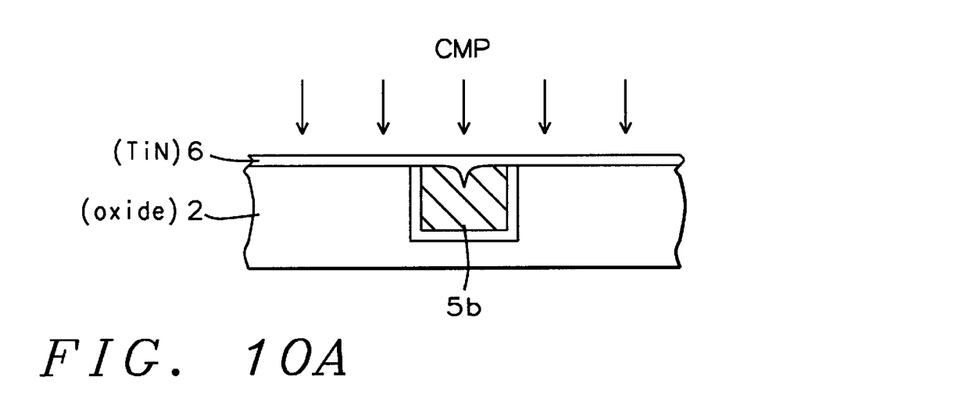
FIG. 10A is a cross-sectional schematic view of the present invention before the CMP of the respective seam filled metal plug.

The inventors have discovered that by using a conductor layer, preferably titanium nitride (TiN), in place of the $SiO_2$ insulator layer, the chemical mechanical polishing (CMP) step to planarize the TiN recess filled W plug provides for a W plug flush with the $SiO_2$ IMD layer as detailed below. FIGS. 10A and 11A illustrate the effects of the chemical mechanically polishing (CMP) of the conductor layer filled recesses 6 of the W plug 5b of the present invention while FIGS. 10B and 11B (with mostly analogous numbering to the figures of the present invention with a suffix "f") illustrate the effects of the chemical mechanically polishing (CMP) of the insulator layer filled recesses 6f of the W plug 5bf of the insulator layer filled W plug recess structure. FIG. 9 is a table summarizing the major differences between the present invention and the one-time fusible link that uses an insulator layer to fill in the recesses of the metal (tungsten) plug,.

Figure 2:
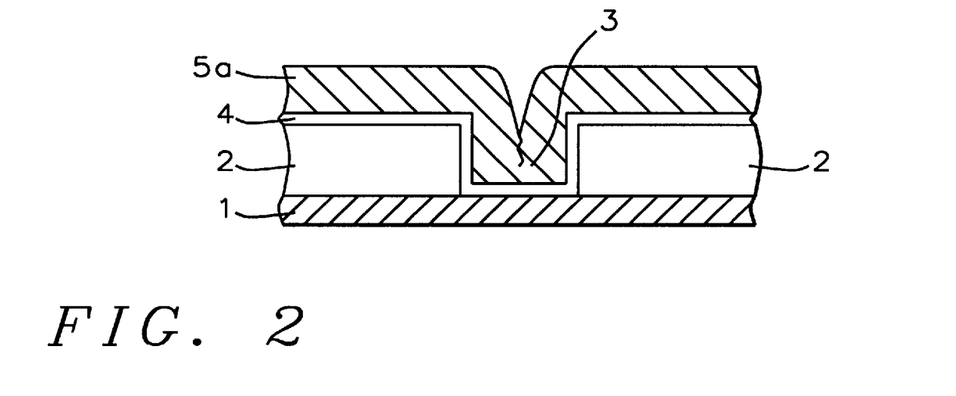
FIGS. 2–7, are a series of schematic, cross-sectional views illustrating the stages of fabrication used to form the one-time fusible link, using an antifuse based interconnect structure.

As shown in FIG. 2, a first interconnect structure, 1, is formed on an underlying semiconductor structure, (not shown), with the first interconnect structure 1, either contacting a conductive region of the underlying semiconductor structure, or contacting a wiring level, that in turn contacts a conductive region in the semiconductor structure. For example, first interconnect structure 1 can be a first level conductive line (polysilicon or metal), or second or higher level conductive line.

The semiconductor structure is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

First interconnect structure 1 is created by initially depositing a layer of an aluminum based metallization, such as pure aluminum; aluminum with between about 0 to 3% copper; or aluminum with between about 0 to 3% copper and with between about 0 to 1% silicon. The aluminum based metallization is deposited using r.f. sputtering, to a thickness between about 3000 to 5000 Angstroms (Å). A layer of titanium nitride is then deposited over the aluminum based layer via r.f. sputtering to a thickness between about 1200 to 1600 Å. The metallization used for the first interconnect structure can also be tungsten or tungsten silicide. Patterning of the metal layer is performed using conventional photolithographic and anisotropic reactive ion etching procedures, using $Cl_2$ as an etchant, creating first interconnect structure 1, used as the lower electrode of the antifuse based interconnect structure.

Next, an intermetal dielectric layer (IMD) 2 comprised of silicon oxide is deposited using plasma enhanced chemical vapor deposition (PECVD) to a thickness between about 2.2 to 2.6 µm. IMD layer 2 is then planarized by chemical mechanical polishing. The CMP procedure removes between about 8000 to 12000 Å of IMD layer 2. Conventional photolithographic and anisotropic RIE procedures, using $CHF_3$ as an etchant, are used to open via hole 3, in IMD layer 2. Via hole 3, with a diameter between about 0.4 to 0.6 µm, results in the exposure of the top surface of first interconnect structure 1.

A barrier layer of titanium nitride 4 is then deposited using r.f. sputtering procedures to a thickness between 800 to 1200 Å, coating the exposed surfaces of via hole 3. Tungsten layer 5a is then deposited via low pressure chemical vapor deposition (LPCVD) procedures to a thickness between about 4000 to 6000 Å, filling via hole 3.

Figure 3:
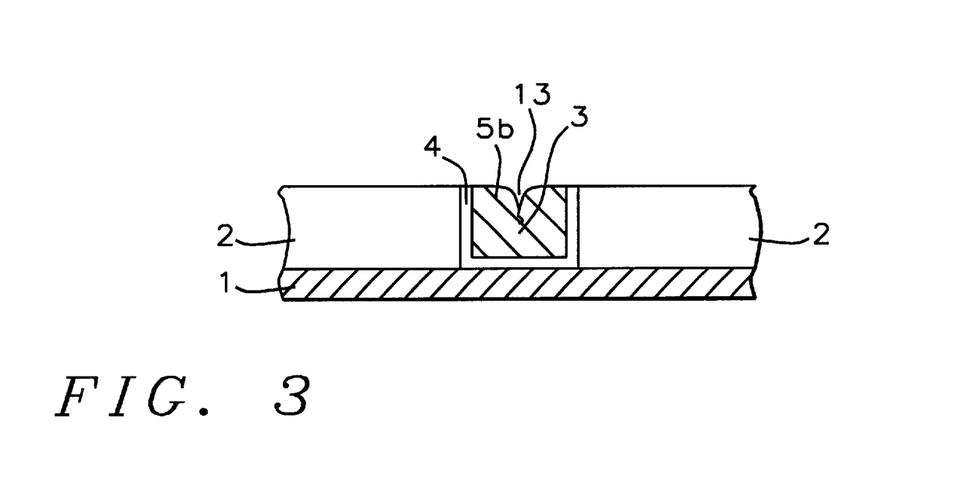

As shown in FIG. 3, the portions of tungsten layer 5a and titanium nitride layer 4 overlying IMD layer 2 may be removed by chemical-mechanical polishing to create, within via hole 3, tungsten plug 5b, and tungsten nitride liner 4. An over etch cycle used to remove any residual metal that can be present due to deposition variations. The same over etch cycle also transfers a seam in the center of the tungsten layer 5a to the tungsten plug 5b as seam 13. Seam 13, if left untreated, would adversely influence the subsequent overlying antifuse layer, via creation of rails in the recesses.

Figure 10B:
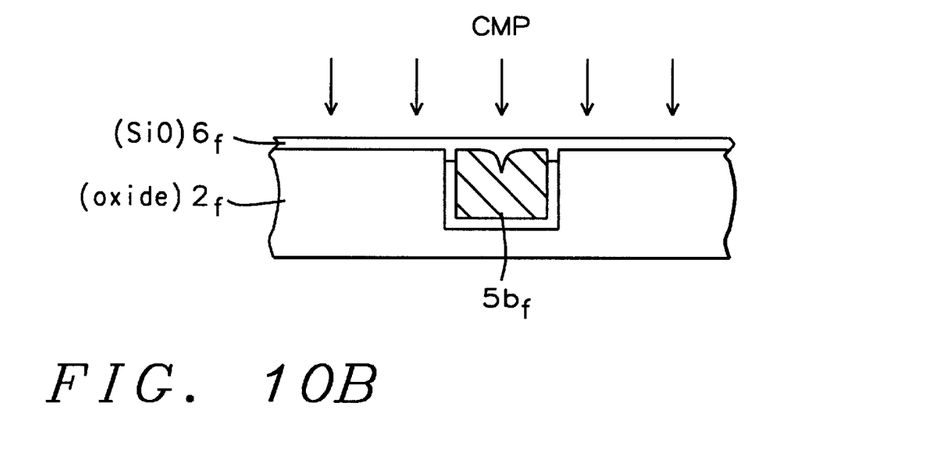
FIG. 10B is a cross-sectional schematic views of a one-time fusible link that uses an insulator layer to fill in the seam and recesses of the metal plug before the CMP of the recess filled metal plug.
Figure 11A:
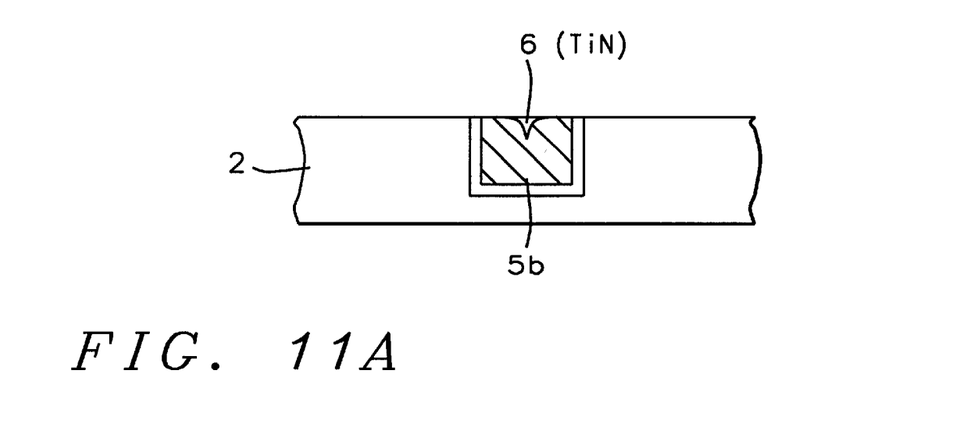
FIG. 11A is a cross-sectional schematic view of the present invention showing the effects of the CMP of the seam filled metal plug.
Figure 11B:
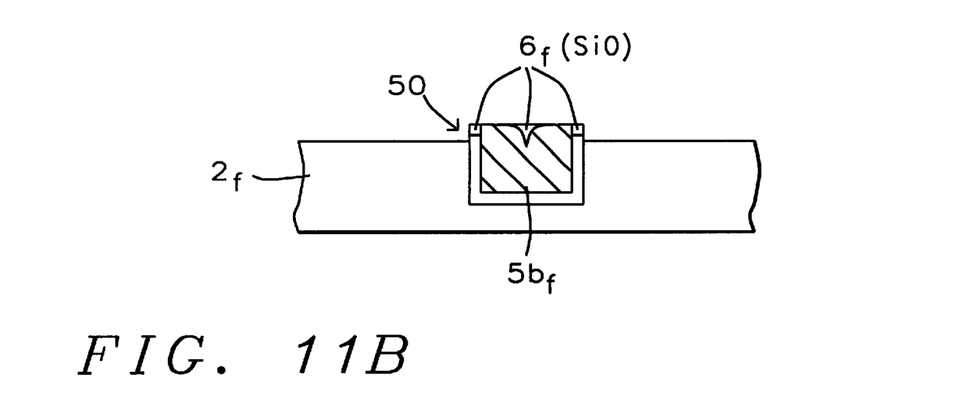
FIG. 11B is a cross-sectional schematic view of the one-time fusible link of FIG. 10B that uses an insulator layer to fill in the seam and recesses of the metal plug showing the effects of the CMP of the seam and recess filled metal plug.

However, as shown in FIGS. 1, 10B, and 11B, and noted above, use of an insulator material, such as $SiO_2$, to fill the seam leads to tungsten plug 5bf being higher than $SiO_2$ intermetal dielectric layer (IMD) 2f as shown at 50 because of the good sensitivity for TiN (metal) CMP on oxide (IMD) but bad sensitivity for $SiO_2$ CMP on oxide (IMD). Use of $SiO_2$ also causes peeling on W.

Figure 4:
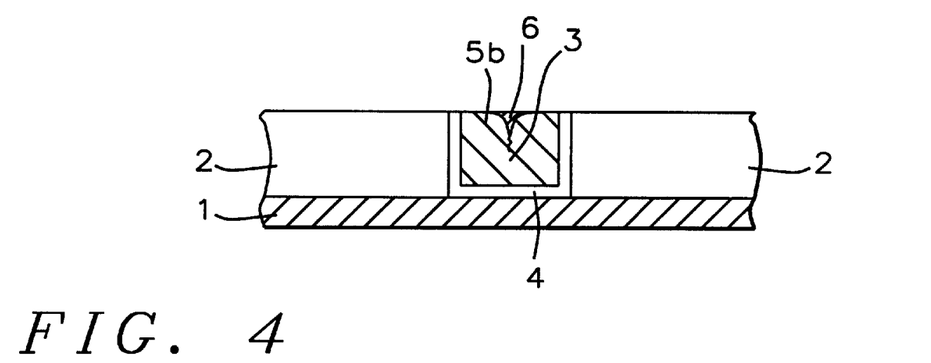

As shown in FIG. 4, the inventors have found that a layer of a conductor material, such as tungsten (W) or tantalum nitride (TaN), and more preferably titanium nitride (TiN), should be deposited instead of an $SiO_2$ insulator layer. TiN is deposited using PECVD procedures, to a thickness between about 800 to 1200 Å. The TiN layer (not shown) is planarized by another CMP procedure resulting in the filling of seam 13 to form seam fill 6 and in a smooth planarized top surface of tungsten plug 5b that is flush with the top surface of IMD layer 2.

Figure 5:
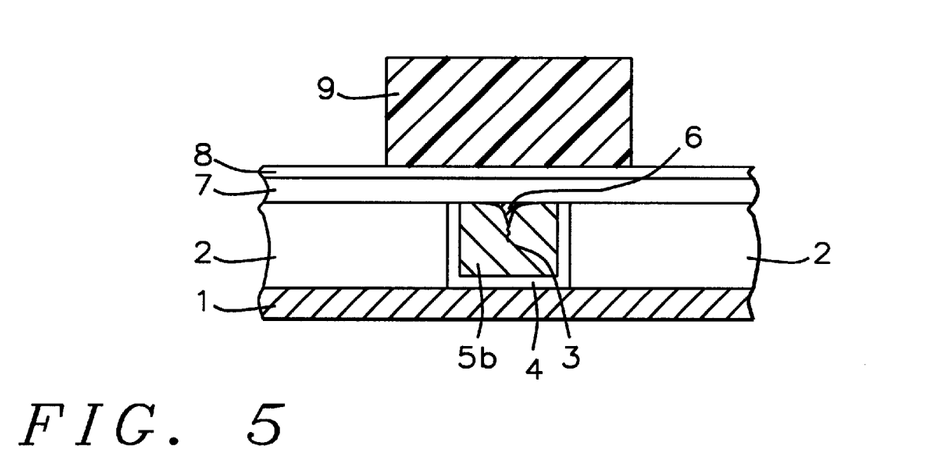

As shown in FIG. 5, a layer of amorphous silicon 7 is deposited using PECVD procedures at a temperature between about 350° to 450° C., to a thickness between about 800 to 1200 Å.

Amorphous silicon layer 7, will be the layer ruptured, via high voltage pulsing, to form a conductive link between underlying first interconnect structure 1, and a subsequent, overlying second interconnect structure, as desired. Therefore the thickness of the antifuse layer is critical in choosing the correct pulsing voltage. If patterning of amorphous silicon layer 7, were performed using conventional photolithographic procedures, the photoresist removal procedure can result in unwanted growth of oxide during the oxygen ashing process resulting in possible pulsing voltage uncertainties.

Therefore to protect the critical antifuse layer from direct exposure to photolithographic procedures, an overlying layer of titanium nitride 8 is deposited using r.f. sputtering procedures to a thickness between about 200 to 300 Å. Amorphous silicon layer 7 and titanium nitride layer 8 comprise the composite antifuse layer. A layer of titanium oxide, oxidized nitride, (ON), or oxidized nitride-oxide, (ONO) can be used instead of amorphous layer in layer 7, also protected during subsequent processing by thin overlying barrier layer 8. Further, a layer of titanium-tungsten can be used instead of titanium nitride in layer 8. Photoresist shape 9 interfaces titanium nitride layer 8, not amorphous silicon layer 7.

Figure 6:
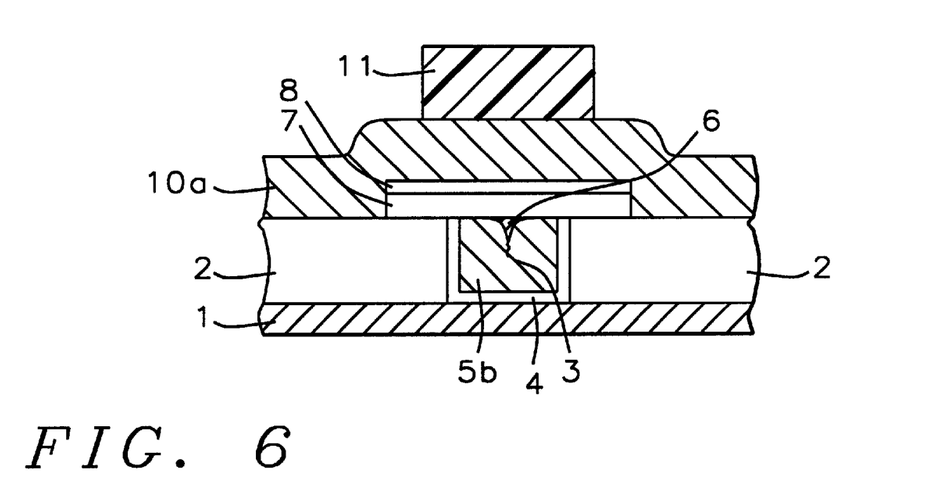

As shown in FIG. 6, titanium nitride layer 8 and amorphous silicon layer 7 are patterned by anisotropic RIE procedures using photoresist shape 9 as a mask to form the composite antifuse shape having a diameter between about 0.7 to 0.9 µm and directly overlying tungsten plug 5b. The anisotropic RIE procedure uses $Cl_2$ as an etchant. Photoresist shape 9 is then removed via oxygen ashing and wet clean procedures to expose titanium nitride layer 8 overlying the protected, critical amorphous silicon layer 7.

Metal layer 10a, comprised of an aluminum based layer that can contain copper and silicon, is then deposited using r.f. sputtering procedure to a thickness between about 6000 to 10000 Å Metal layer 10a is needed for a second interconnect structure, or the upper electrode of the antifuse interconnect structure. Metal layer 10a is placed between an underlying layer of titanium nitride having a thickness between about 500 to 1000 Å, and an overlying layer of titanium nitride having a thickness between about 200 to 300 Å.

Photoresist shape 11, to be used as a mask for the creation of the second interconnect structure, is then deposited. The second interconnect structure may be a metal line.

Figure 7:
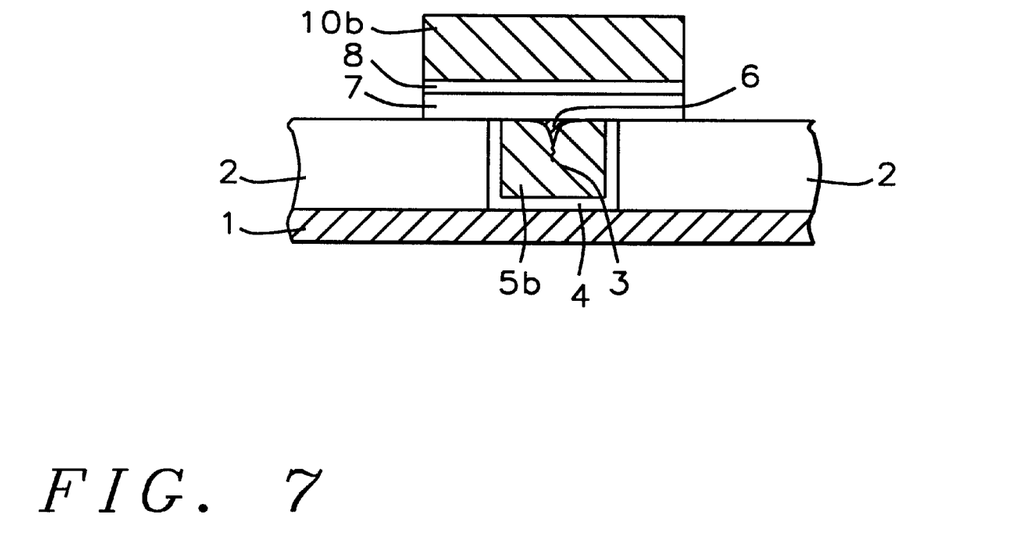

As shown in FIG. 7, an anisotropic RIE is used to create second interconnect structure 10b and the shapes for the comprised antifuse layers of titanium nitride 8, and amorphous silicon 7. $CF_4$ or $CHF_3$ are used as etchants for this anisotropic RIE. The width of second interconnect structure 10b is between about 0.7 to 0.9 µm.

Photoresist shape 11 is then removed via oxygen plasma ashing and wet cleans resulting in the antifuse interconnect structure featuring amorphous silicon antifuse layer 7, placed between conductive electrodes (second interconnect structure 10b and conductor layer 6 filled W plug 5b).

Figure 8:
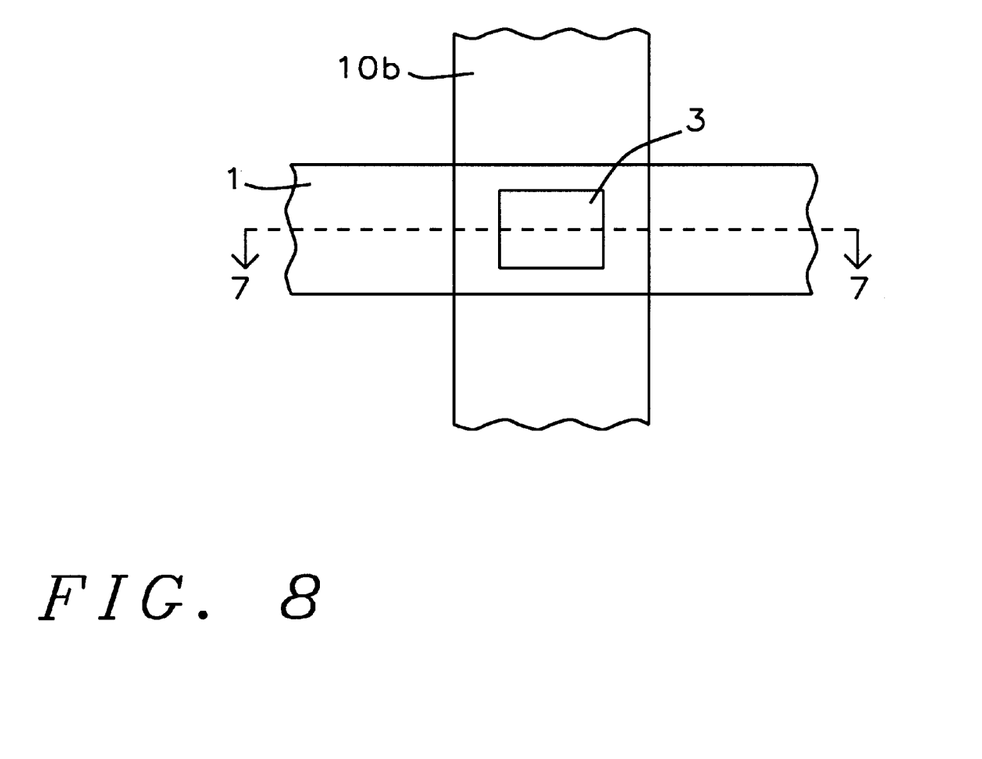
FIG. 8, which shows a top view of the antifuse based interconnect structure.

A top view of the antifuse interconnect structure of the present invention is shown in FIG. 8.

While particular embodiments of the present invention have been illustrated and described, it is not intended to limit the invention, except as defined by the following claims.

We claim:

1. A method of forming an antifuse based interconnect structure, comprising the steps of:

providing a semiconductor structure having a first interconnect structure;

depositing an insulator layer, on said first interconnect structure;

forming a via hole in said insulator layer, exposing top surface of said first interconnect structure;

forming a metal plug in said via hole; said metal plug having a seam;

forming a conductor layer over said metal plug, filling said seam;

chemical-mechanically polishing said conductor layer to remove the excess said conductor layer and forming a seam fill;

forming an antifuse layer contacting said metal plug and said seam fill; and forming a second interconnect structure, contacting said antifuse layer.

2. The method of claim 1, wherein said active elements in said semiconductor structure, are MOSFET devices, configured in a gate array pattern.

3. The method of claim 1, wherein said first interconnect structure is formed from an underlying aluminum based layer, containing between about 0 to 3% copper and between about 0 to 1% silicon at a thickness between about 3000 to 5000 Å, and an overlying titanium nitride layer at a thickness between about 1200 to 1600 Å.

4. The method of claim 1, wherein said first interconnect structure can be formed from a material selected from the group of tungsten, titanium-tungsten, or tungsten silicide.

5. The method of claim 1, wherein said insulator layer is silicon oxide, deposited using PECVD procedures, at a thickness between about 2.2 to 2.6 $\mu$m, and planarized using CMP procedures to create a final thickness for said insulator layer between about 1.2 to 1.6 $\mu$m.

6. The method of claim 1, wherein said via hole, in said insulator layer, is formed via anisotropic RIE, using $CHF_3$ as an etchant, with said via hole having a diameter between about 0.4 to 0.6 $\mu$m.

7. The method of claim 1, wherein said metal plug is formed from a tungsten layer obtained via LPCVD deposition at a thickness between about 4000 to 6000 Å.

8. The method of claim 1, wherein said metal plug, in said via hole, and said sidewall spacers are formed by a W CMP.

9. The method of claim 1, wherein said conductor layer is comprised of a material selected from the group comprising titanium nitride, tungsten, and tantalum nitride; said conductor layer being deposited via PECVD procedures to a thickness between about 800 to 1200 Å, followed by a CMP procedure.

10. The method of claim 1, wherein said antifuse layer is a composite layer, comprised of an underlying amorphous silicon layer deposited using PECVD procedures at a temperature between about 350° to 450° C., to a thickness between about 800 to 1200 Å, and an overlying layer of titanium nitride at a thickness between about 200 to 300 Å.

11. The method of claim 1, wherein said antifuse layer can be selected from a group of materials that include titanium oxide, oxidized nitride, (ON), or oxidized nitride-oxide, (ONO), all protected with an overlying layer of titanium nitride.

12. The method of claim 1, wherein said antifuse layer is patterned using photolithographic and anisotropic RIE procedures using $Cl_2$ as an etchant.

13. The method of claim 1, wherein said second interconnect structure is formed from an aluminum based layer, containing copper, silicon, titanium nitride, or titanium-tungsten.

14. The method of claim 1, further including the step of:
forming a liner in said via hole before said metal plug formation.

15. The method of claim 1, further including the step of:
forming a liner in said via hole before said metal plug formation; wherein said liner is comprised of titanium nitride.

16. A method for forming an antifuse based interconnect structure, with the antifuse layer shape formed from a titanium nitride layer, overlying an amorphous silicon layer, comprising the steps of:

providing a semiconductor structure having a first interconnect structure;

depositing an insulator layer on said first interconnect structure;

planarizing said insulator layer;

forming a via hole in said insulator layer, exposing top surface of said first interconnect structure;

depositing a first titanium nitride layer, coating the sides of said via hole;

depositing a tungsten layer, filling said via hole;

removing said first titanium nitride layer, and said tungsten layer, from the top surface of said insulator layer, forming a titanium nitride liner and a tungsten plug, in said via hole; said tungsten plug having a seam;

depositing a conductor layer, filling said seam;

chemical-mechanically polishing said conductor layer to remove the excess said conductor layer and forming a seam fill;

depositing an amorphous silicon layer;

depositing a second titanium nitride layer, on said amorphous silicon layer;

patterning said second titanium nitride layer, and said amorphous silicon layer, to form said antifuse layer shape, comprised of said second titanium nitride layer, overlying said amorphous silicon layer; and forming a second interconnect structure contacting underlying said antifuse layer shape.

17. The method of claim 16, wherein said active elements in said semiconductor structure are MOSFET devices, configured in a gate array pattern.

18. The method of claim 16, wherein said first interconnect structure is formed from an underlying aluminum based layer, containing between about 0 to 3% copper, and between about 0 to 1% silicon, at a thickness between about 3000 to 5000 Å, and an overlying titanium nitride layer at a thickness between about 1200 to 1600 Å.

19. The method of claim 16, wherein said insulator layer is silicon oxide, deposited using PECVD procedures, to a thickness between about 2.2 to 2.6 $\mu$m.

20. The method of claim 16, wherein said insulator layer is planarized using CMP procedures, reducing said insulator thickness to between about 1.2 to 1.6 $\mu$m.

21. The method of claim 16, wherein said via hole is formed in said insulator layer via anisotropic RIE procedures, using $CHF_3$ as an etchant.

22. The method of claim 16, wherein said first titanium nitride layer is deposited using r.f. sputtering to a thickness between about 800 to 1200 Å.

23. The method of claim 16, wherein said tungsten layer is deposited using LPCVD procedures at a thickness between about 4000 to 6000 Å.

24. The method of claim 16, wherein said titanium nitride liner and said tungsten plug are formed in said via hole, via W CMP.

25. The method of claim 16, wherein said amorphous silicon layer is deposited using LPCVD procedures, at a temperature between about 350° to 450° C., to a thickness between about 800 to 1200 Å.

26. The method of claim 16, wherein said second titanium nitride layer is deposited using r.f. sputtering to a thickness between about 200 to 300 Å.

27. The method of claim 16, wherein said antifuse layer shape is formed via anisotropic RIE of said second titanium nitride layer, and of said amorphous silicon layer, using $Cl_2$ as an etchant.

28. The method of claim 16, wherein said second interconnect structure is formed from an aluminum based layer, that can contain copper, silicon, titanium nitride, or titanium-tungsten.

29. The method of claim 16, wherein said conductor layer is comprised of a material selected from the group comprising titanium nitride, tungsten, or tantalum nitride.

30. A method for forming an antifuse based interconnect structure, with the antifuse layer shape formed from a titanium nitride layer, overlying an amorphous silicon layer, comprising the steps of:

providing a semiconductor structure having a first interconnect structure;

depositing an insulator layer on said first interconnect structure;

planarizing said insulator layer;

forming a via hole in said insulator layer, exposing top surface of said first interconnect structure;

depositing a first titanium nitride layer, coating the sides of said via hole;

depositing a tungsten layer, completely filling said via hole;

removing said first titanium nitride layer, and said tungsten layer, from top surface of said insulator layer, forming titanium nitride liner and a tungsten plug, in said via hole; said tungsten plug having a seam;

depositing a conductor layer comprised of a material selected form the group comprising tungsten nitride, tungsten, and tantalum nitride; said conductor layer filling said seam;

chemical-mechanically polishing said conductor layer to remove the excess said conductor layer and forming a seam fill;

depositing an amorphous silicon layer;

depositing a second titanium nitride layer, on said amorphous silicon layer;

patterning said second titanium nitride layer, and said amorphous silicon layer, to form said antifuse layer shape, comprised of said second titanium nitride layer, overlying said amorphous silicon layer; and forming a second interconnect structure, contacting underlying, said antifuse layer shape.

31. A method of forming an antifuse based interconnect structure, comprising the steps of:

providing a semiconductor structure having a first interconnect structure; wherein said first interconnect structure can be formed from a material selected from the group of tungsten, titanium-tungsten, or tungsten silicide depositing an insulator layer, on said first interconnect structure;

forming a via hole in said insulator layer, exposing top surface of said first interconnect structure;

forming a metal plug in said via hole; said metal plug having a seam;

forming a conductor layer over said metal plug, filling said seam; wherein said conductor layer is comprised of a material selected from the group comprising titanium nitride, tungsten, and tantalum nitride;

chemical-mechanically polishing said conductor layer to remove the excess said conductor layer and forming a seam fill;

forming an antifuse layer contacting said metal plug and said seam fill; and forming a second interconnect structure, contacting said antifuse layer.

32. The method of claim 31, wherein said active elements in said semiconductor structure, are MOSFET devices, configured in a gate array pattern.

33. The method of claim 31, wherein said first interconnect structure is formed from an underlying aluminum based layer, containing between about 0 to 3% copper and between about 0 to 1% silicon at a thickness between about 3000 to 5000 Å, and an overlying titanium nitride layer at a thickness between about 1200 to 1600 Å.

34. The method of claim 31, wherein said insulator layer is silicon oxide, deposited using PECVD procedures, at a thickness between about 2.2 to 2.6 $\mu$m, and planarized using CMP procedures to create a final thickness for said insulator layer between about 1.2 to 1.6 $\mu$m.

35. The method of claim 31, wherein said via hole, in said insulator layer, is formed via anisotropic RIE, using $CHF_3$ as an etchant, with said via hole having a diameter between about 0.4 to 0.6 $\mu$m.

36. The method of claim 31, wherein said metal plug is formed from a tungsten layer obtained via LPCVD deposition at a thickness between about 4000 to 6000 Å.

37. The method of claim 31, wherein said metal plug, in said via hole, and said sidewall spacers are formed by a W CMP.

38. The method of claim 31, wherein said conductor layer being deposited via PECVD procedures to a thickness between about 800 to 1200 Å, followed by a CMP procedure.

39. The method of claim 31, wherein said antifuse layer is a composite layer, comprised of an underlying amorphous silicon layer deposited using PECVD procedures at a temperature between about 350° to 450° C., to a thickness between about 800 to 1200 Å, and an overlying layer of titanium nitride at a thickness between about 200 to 300 Å.

40. The method of claim 31, wherein said antifuse layer can be selected from a group of materials that include titanium oxide, oxidized nitride, (ON), or oxidized nitride-oxide, (ONO), all protected with an overlying layer of titanium nitride.

41. The method of claim 31, wherein said antifuse layer is patterned using photolithographic and anisotropic RIE procedures using $Cl_2$ as an etchant.

42. The method of claim 31, wherein said second interconnect structure is formed from an aluminum based layer, containing copper, silicon, titanium nitride, or titanium-tungsten.

43. The method of claim 31, further including the step of:

forming a liner in said via hole before said metal plug formation.

44. The method of claim 31, further including the step of:

forming a liner in said via hole before said metal plug formation; wherein said liner is comprised of titanium nitride.

* * * * *